(12) United States Patent
Sainty et al.

(10) Patent No.: US 7,498,586 B2
(45) Date of Patent: Mar. 3, 2009

(54) ION SOURCE CONTROL SYSTEM

(75) Inventors: Wayne Sainty, Sydney (AU); William Vince Waller, Wyoming (AU)

(73) Assignee: Saintech Pty, Ltd., Sydney (AU)

( * ) Notice: Subject to any disclaimer, the term of this patent is extended or adjusted under 35 U.S.C. 154(b) by 172 days.

(21) Appl. No.: 10/577,421

(22) PCT Filed: Aug. 13, 2004

(86) PCT No.: PCT/AU2004/001082

§ 371 (c)(1),
(2), (4) Date: Apr. 27, 2006

(87) PCT Pub. No.: WO2005/045874

PCT Pub. Date: May 19, 2005

(65) Prior Publication Data

US 2007/0089980 A1   Apr. 26, 2007

(30) Foreign Application Priority Data

Oct. 31, 2003   (AU)   ............................ 2003906001

(51) Int. Cl.
*H01J 27/02*   (2006.01)
(52) U.S. Cl. ........................ 250/423 R; 250/492.21; 250/492.1; 250/427; 250/492.2; 250/493.1; 250/424; 250/426; 313/362.1; 315/111.01; 315/111.21; 315/111.81; 315/111.91

(58) Field of Classification Search ............ 250/492.21, 250/423 R, 427, 492.2, 493.1, 424, 426; 313/362.1; 315/111.01, 111.21, 111.81, 111.91
See application file for complete search history.

(56) References Cited

U.S. PATENT DOCUMENTS

| 4,862,032 | A  | * | 8/1989  | Kaufman et al. | ......... 313/359.1 |
| 4,939,425 | A  | * | 7/1990  | Bernardet      | ............. 315/111.21 |
| 6,388,384 | B1 | * | 5/2002  | Pierrejean     | ............. 315/111.81 |
| 6,645,301 | B2 | * | 11/2003 | Sainty         | ........................ 118/665 |
| 6,734,434 | B1 | * | 5/2004  | Sainty         | .................... 250/423 R |
| 6,849,854 | B2 | * | 2/2005  | Sainty         | .................... 250/423 R |

OTHER PUBLICATIONS

Pollard, et al. "Electron-impact ionization time-of-flight mass spectrometer for molecular beams" Rev. Sci. Instrum. 56(1) Jan. 1987 pp. 32-37.*

* cited by examiner

*Primary Examiner*—Jack I Berman
*Assistant Examiner*—Michael Maskell

(57) ABSTRACT

A gridless ion source operates from a control system (201) that generates an anode voltage (215) comprising a mains rectified signal such that the anode voltage modulates between a first voltage above a threshold and a second voltage below the threshold. The mains rectified signal is provided by transformer (210) receiving a mains input (211). The output of the transformer (213) is rectified by a bridge rectifier (214). In preferred embodiments, the threshold is an ionization threshold such that the ion current is initiated and extinguished in every cycle.

30 Claims, 5 Drawing Sheets

ION SOURCE CONTROL SYSTEM

FIELD OF THE INVENTION

This invention relates to a control system for an ion source, in particular, a control system for an open ended gridless ion source.

BACKGROUND OF THE INVENTION

In the field of thin film fabrication, gridless ion sources have been known, for example from U.S. Pat. No. 4,862,032, as providing a broad area ion beam capable of providing ion assistance for the thin film deposition process.

Systems such as those described in U.S. Pat. No. 4,862,032 require relative large gas flows in order to initiate and maintain the ion current. Because of these large gas flows, the ion source is susceptible to transients that can occur in the vacuum chamber in which these systems operate. The control systems have therefore required circuitry to handle instabilities that may be generated. Any fluctuation within the vacuum chamber would cause a rapid drop in the anode voltage or gas flow or both, that prevented transient spikes from developing into a catastrophic event, such as arcing in the vacuum chamber. If the transient signal was large enough, the power supply would cut out altogether.

The process of generating the ion current is complex and depends on many factors. It can therefore be difficult to distinguish a catastrophic event from the usual fluctuations that occur in producing the ion current. For example, the onset of the ion current itself produces a transient signal. However, for best protection, prior art control systems have been over designed such that often the power supply to the ion source would cut out unnecessarily. The range of operation of the ion source was therefore limited to regions where the ion source was known to be fully stable.

The ion source control system therefore allows itself to be dictated to by the vacuum chamber environment in order to achieve stable operation, which can be frustrating to the user seeking to operate the ion source under a particular set of parameters. Furthermore, it can take of the order of several seconds for the ion source to achieve stable operation, both at the initial onset of the ion current, and when any perturbation of the chamber environment occurs. It is therefore in the interests of the user to operate the ion source conservatively in an attempt to prevent the power supply cutting out and to maintain stable operation. This provides a substantial limitation on the range of operation of the ion source.

Recent advances by the present applicant, as detailed in PCT/AU99/00591 and PCT/AU01/01548 the contents of which are herein incorporated by reference, have provided a gridless ion source having far greater gas ionization efficiency than was previously known. Greater gas efficiency allows the same ion current to be produced from a reduced gas flow with greater stability and more reliability in initiating the ion current. However, these systems have tended to operate with a power supply as is typical in the prior art, and thus have been known to cut out due to spurious events in the vacuum chamber even though those spurious events are not true catastrophic events.

SUMMARY OF THE INVENTION

Accordingly, in a first aspect, the invention resides in a method of operating an ion source comprising providing a voltage signal to an anode of the ion source, providing a signal to a gas supply of the ion source to cause gas to be provided to an ionization region of the ion source, providing a signal to a cathode of the ion source to cause electrons to be emitted by the cathode such that electrons emitted by the cathode are accelerated toward the anode to cause ionization of the gas, thereby producing an ion current, wherein the anode voltage signal comprises a voltage that modulates between a first voltage above a threshold and a second voltage below the threshold.

In a first embodiment, the threshold is an ionization threshold. Preferably the threshold and the frequency and duty cycle of the modulation are set so as to extinguish the ion current during the period where the anode voltage signal is below the threshold. Preferably the second voltage is zero.

In an alternative embodiment, the threshold is a fault condition threshold. Preferably the threshold and the frequency and duty cycle of the modulation are set so as to alleviate a fault condition during the period where the anode voltage signal is below the threshold.

In a further embodiment, the anode voltage signal modulates above and below a fault condition threshold only during the presence of the fault condition.

Preferably the frequency of the voltage cycle is greater than 1 Hz, more preferably greater than 10 Hz and more preferably is greater than 100 Hz.

Preferably the anode voltage comprises a rectified mains signal

Preferably the anode voltage signal is unregulated.

In a further aspect, the invention resides in a control system for an ion source comprising an anode voltage generator, a gas supply signal generator and a cathode signal generator, wherein the anode voltage generator provides a voltage signal to an anode of the ion source, wherein the gas supply signal generator generates a signal to cause a gas to be provided to an ionization region of the ion source, wherein the cathode signal generator generates a signal to cause electrons to be emitted by a cathode of the ion source such that electrons emitted by the cathode are accelerated toward the anode to cause ionization of the gas, and wherein the anode voltage generated comprises a voltage that modulates between a first voltage above a threshold and a second voltage below the threshold.

In one embodiment, the voltage signal generator comprises a circuit providing a mains rectified voltage. Preferably the circuit provides a variable mains rectified voltage.

In a further aspect, the invention resides in an ion beam system comprising an ion source head and a control system, the ion source head comprising an anode, an electron emitting cathode, an ionization region disposed between said anode and said cathode, and a gas supply, the control system comprising an anode voltage generator for providing a voltage signal to the anode, wherein the anode voltage signal comprises a voltage that modulates between a first voltage above a threshold and a second voltage below the threshold.

BRIEF DESCRIPTION OF THE DRAWINGS

The invention will now be described, by way of example only, with reference to specific embodiments, and to the accompanying figures in which.

DETAILED DESCRIPTION OF PREFERRED EMBODIMENTS

PCT/AU01/01548 to the present applicant, describes a gridless ion source that operates in a pulsed mode. One of the embodiments thereof describes an ion source in which the anode voltage is pulsed in order to produce an intermittent ion current. Specific examples describe the period of the anode voltage being of the order of 1 second.

It has been recognized by the present inventors that where the ion source can repeatedly initiate the ion current, the control systems can operate the ion source so as to intermittently extinguish the ion current. The present inventors have further recognized that if the ion current is extinguished on a timescale at which instabilities are produced, or faster, then the complex protection circuitry required for detecting and eliminating instabilities can be reduced or removed altogether.

Figure 1:
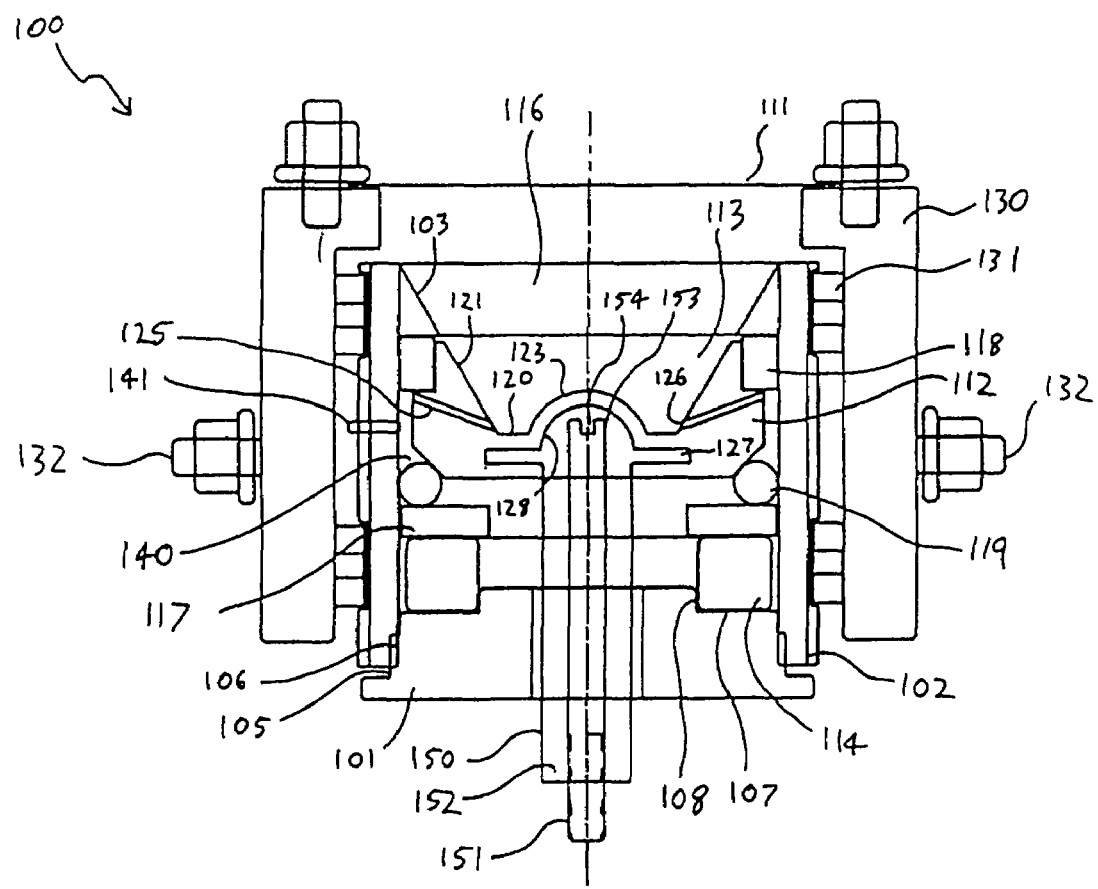
FIG. 1 is a partial cross-sectional elevation of an source operable according to the invention.
Figure 2:
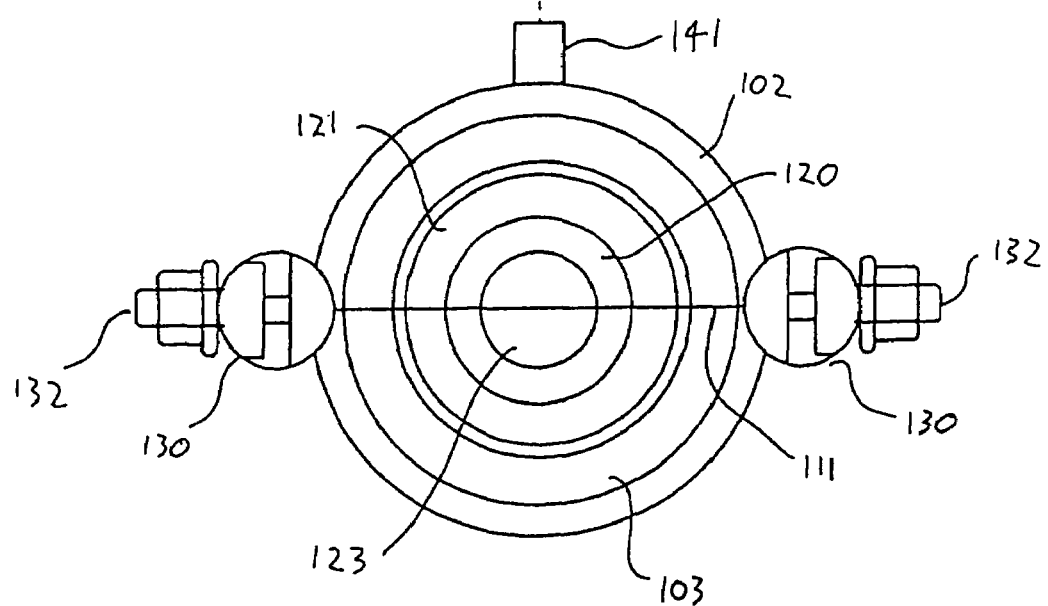
FIG. 2 is a plan view of the ion source in FIG. 1.

With reference to FIGS. 1 and 2, there is shown an ion source 100 in accordance with a preferred embodiment of the invention. The ion source 100 includes a base plate 101 that screws or otherwise engages with a cylindrical shroud 102. The shroud has an inner sloping surface 103 that defines an open end 116 of an ionisation region 113 to be described below. The base plate 101 has a collar 105, extending upward from which is a threaded section 106 for engagement with the shroud 102. The base 101 has an upper annular face 107. An inner circumferential flange 108 extends from the face 107 to locate a ring magnet 114 thereon. The magnet is preferably a high flux rare earth magnet such as an NdFeB magnet Disposed on the magnet 114 is a spacer 117, for example of aluminium, that provides a radiation shield to prevent the magnet 114 from overheating due to radiation from the anode 112.

The anode 112 has an end wall 120 and an outwardly sloping side wall 121. The side wall and end wall together define the ionisation region 113. A filament 111 is supported at the open end 116 of the ionisation region 113 by filament support legs 130. The filament legs 130 are connected to the shroud 102 through insulating mountings 131 to electrically isolate the filament legs 130 from the shroud 102. The filament legs 130 are each electrically conducting and have an electrical connection point 132 for connecting into a filament supply circuit (not shown).

A projection 123 extends from the anode end wall 120 into the ionisation region 113. The projection 123 shown in FIG. 1 is curved having an apex located on an axis of the anode. In alternative embodiments, the projection may have angled faces or the like. The projection provides a focal point for the electrons emitted by the cathode.

The anode 112 is located within the shroud by upper and lower insulating rings 118, 119. A gas chamber 140 is defined by the anode 112, the insulating rings 118,119 and the inside surface of the shroud 102. The upper insulator 118 is a rigid insulator for holding and locating the anode 112 properly in place. The insulator 118 is also required to have a high temperature resistance and low thermal expansion in order that the insulator provides a seal for the gas chamber under operating conditions. Preferred materials for the upper insulator include glass, ceramic or polymers such as PEEK (polyethylethylketone). The lower insulator is preferably a high temperature elastomer ring that provides a resilient seal for the gas chamber 140 when the base 101 is screwed into the shroud.

An inlet 141 (FIG. 2) through the shroud is connectable to a gas line (not shown) that supplies gas to the gas chamber 140. Control of the gas flow is governed by a mass flow controller or similar control mechanism disposed upstream of the ion source, as is well known in the art.

Extending through the anode side walls 121 are a plurality of channels 125, each terminating in the ionization region 113 at an aperture 126 disposed adjacent the end wall 120. The channels 125 provide a conduit from the gas chamber 140 to the ionization region 113. The channels 125 extend downwardly (as depicted in FIG. 1) from the outer anode wall to the ionization region such that the channels are pointed at the projection 123. This ensures that the incoming gas molecules are on average directed at the projection 123. Gas ionisation efficiency is thereby increased because the gas molecules are introduced in proximity to and in the direction of the region of highest electron concentration and electron energy.

As shown in FIG. 1, the projection 123 is integrally formed with the end wall 120. Also shown within the anode 112 is a cavity 127 that receives a cooling fluid from an inlet conduit 150. The cavity 127 extends to an underside surface 128 of the end wall and the projection 123. The thickness of the end wall is preferably less than 10 mm in order that the cooling fluid can sufficiently cool the projection. The minimum thickness of the end wall and projection is determined only by the limits of the manufacturing processes used to fabricate the anode. In practice, the thickness of the end wall is approximately 2 mm.

The fluid conduit 150 is a coaxial conduit, having an inner conduit 151 for supplying fluid, eg water, to the cavity 127 and an outer conduit 152 for removing fluid from the cavity. The inner conduit 151 extends into the cavity so that the outlet end 153 of the conduit is disposed adjacent the underside surface 128 of the end wall. This ensures that the coolest water is directed at the end wall and projection, which receives the majority of the anode heat load. The outlet 153 of the inner conduit has a notch 154 so that in the event that the inner conduit is inserted into the cavity until the conduit abuts the underside surface of the end wall, the flow of water is not restricted.

The fluid conduit 150 extends through the central aperture of the ring magnet 114 and the base plate 101 and can be used to provide an electrical connection to the anode with electrical breaks provided upstream of the connection.

In operation the anode is provided with a voltage signal that fluctuates above and below an ionisation threshold, which depends on the pressure in the vacuum chamber and the type of gas being used. In many normal operating conditions, the ionisation threshold is of the order of 30-60 Volts, but can be higher. Greater detail of the anode voltage signal will be described below. An AC current of approximately 16 A is passed through the cathode to stimulate electron emission. Electrons generated at the cathode, which is at or near earth potential, are influenced by the anode potential and are accelerated toward it. The magnetic field imparts a spiral motion on the electrons increasing the time which the electrons spend in the ionisation region and thus their potential to ionise gas molecules, and focussing the electrons toward the longitudinal axis. When the anode voltage is sufficiently high, the electrons gain enough energy that collisions with gas molecules cause ionisation. Positive ions created in the ionisation region experience the opposite effect to the electrons and are accelerated away from the anode out of the open end 116 of the ionisation region. The general theory of operation of the ion source is known from Applicant's previous applications referenced above.

Figure 3:
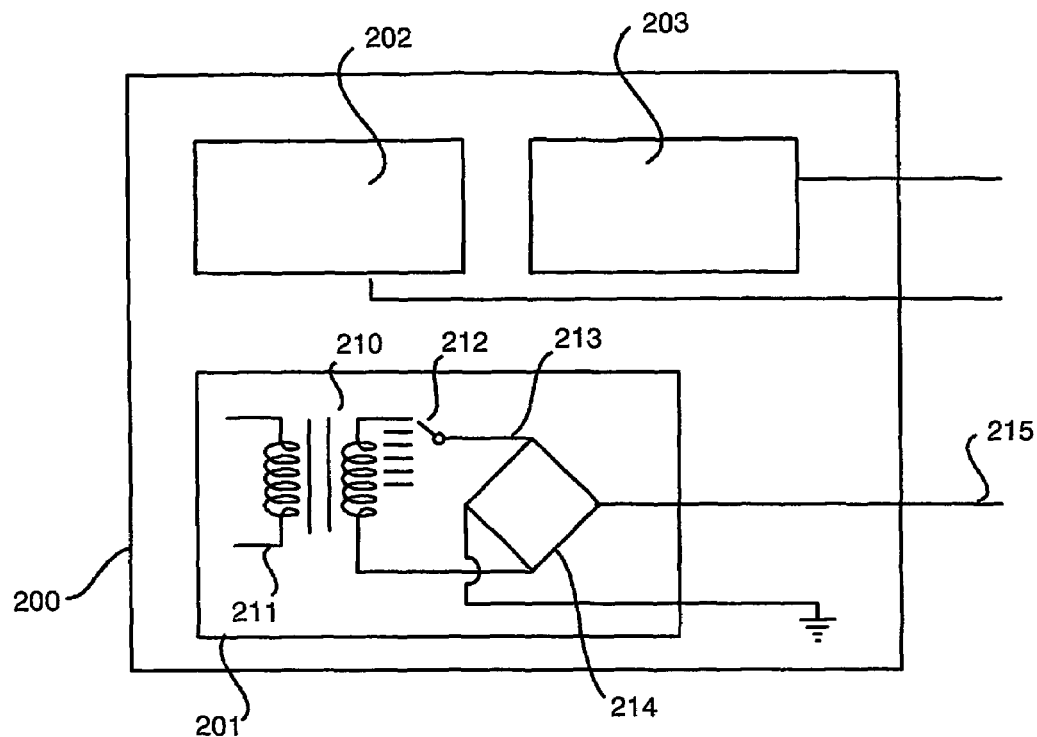
FIG. 3 shows a schematic circuit diagram for the anode signal generator.
Figure 4A:
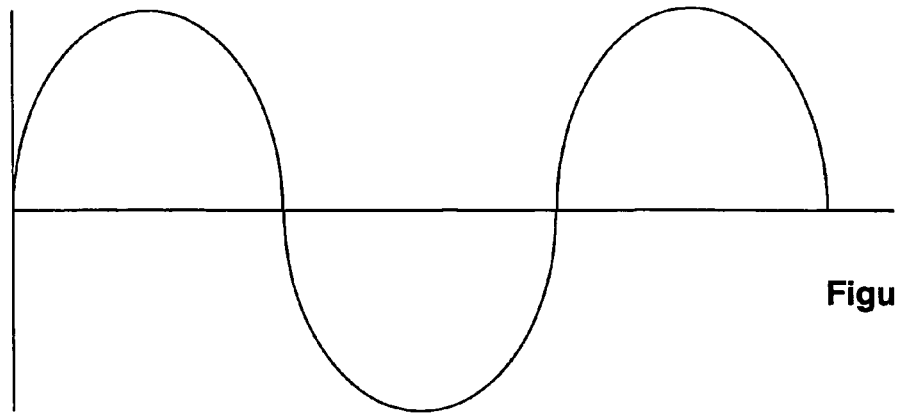
FIG. 4 shows the anode voltage signal produced at different stages of the voltage generating circuit.
Figure 4B:
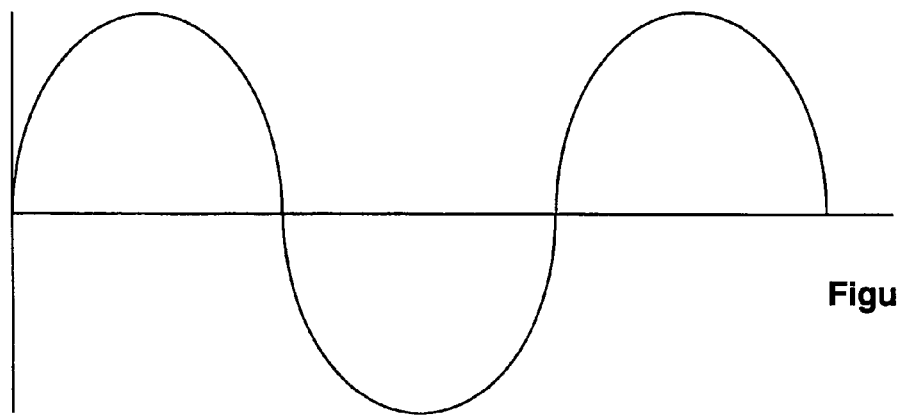
Figure 4C:
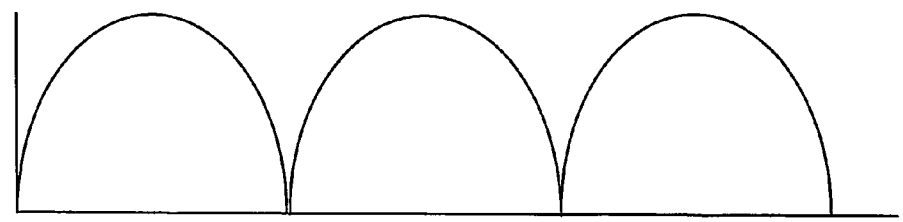

The power supply system of the ion source will now be described with reference to FIG. 3. The power supply 200 comprises a voltage generator circuit 201, a cathode supply circuit 202 and a gas control circuit 203 which operates a mass flow controller or similar control device (not shown). In its simplest form, the anode voltage generator circuit comprises a fully rectified mains voltage signal. A variable output transformer 210 receives a mains supply at the primary end 211, e.g. 240 V, 50 Hz for Australia or 220V, 60 Hz for USA. A sample signal is shown in FIG. 4A. The transformer outputs a variable voltage signal e.g. 0-300 V which may be determined by a dial producing a continuous output range, or by discrete tappings on the transformer secondary windings which are selected through electronic relays 212. The frequency of the transformer output (FIG. 4B) is the same as the frequency at the input (FIG. 4C). The output 213 is passed through a full wave diode bridge circuit 214 which rectifies the negative portion of the AC cycle, converting it to a positive potential. The resultant output (FIG. 4C) becomes the signal 215 provided to the anode of the ion source. As can be seen from FIG. 4, the signal provided to the anode is at twice the frequency of the mains supply.

Figure 5:
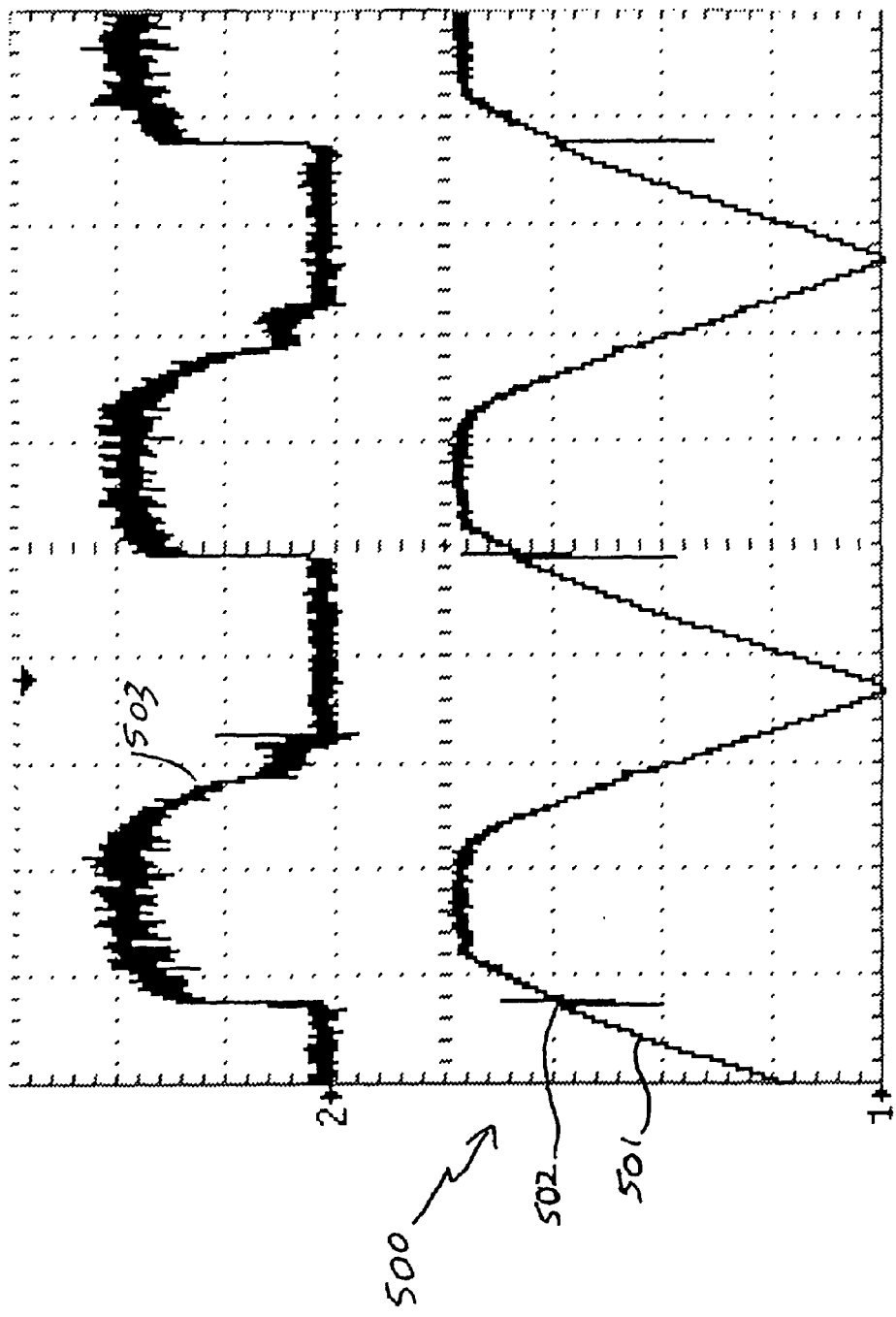
FIG. 5 shows an output of a cathode ray oscilloscope measuring the anode voltage and ion current during a stable operation mode.

FIG. 5 shows a screen capture 500 of a cathode ray oscilloscope monitoring the anode voltage in channel 1 and the ion current in channel 2. The ion current is measured by measuring the voltage across a sense resistor disposed in a wire providing a bias voltage of approximately 100V to a plate positioned approximately 25 cm from the ion source. The plate is biased to approximately negative 60-100 V to remove any signal due to electrons. The anode voltage signal 501 has a frequency of 100 Hz and amplitude 200 V. The anode voltage is unregulated and thus at the onset of the ion current 502, the anode voltage initially drops as the plasma starts to draw power from the anode. As can be seen in FIG. 5, the ion current threshold is approximately 150 V. This threshold will depend on several factors including the gas type, background chamber pressure and gas flow to the ion source. It can further be seen that when the anode voltage drops below the threshold at the end of the cycle 503, the ion current is extinguished almost immediately.

That is, the ion current is produced at a frequency of 100 Hz in synchronization with the anode voltage signal, with approximately 5 ms between pulses of ion current.

If it is desired to reduce the time between ion current pulses, then it is possible to provide A DC offset to the anode voltage signal. For example, for an ionization threshold of 50 V, a 40 V DC offset signal may be provided. The modulating signal therefore only requires to add 10 V before the ionization threshold is reached, and thus the ionization will occur earlier in the anode voltage cycle.

Because the voltage reduces to zero every approximately 10 ms, any fault condition that occurs during the high voltage portion of the cycle is prevented from continuing to build, thereby protecting components within the vacuum chamber.

Typically, fault conditions such as arcing will only occur at voltages well above the ionization threshold. If a continuous ion current is desired, then the anode voltage signal can be provided with a DC offset above the ionization threshold but below the threshold for a fault condition. The anode voltage signal will then cause a continuous ion current to be produced whilst modulating above and below the fault condition threshold. The higher voltages of the cycle will produce a higher ion current with greater ion energy, but fault conditions will be alleviated, without cutting out the power supply, when the anode voltage signal is modulated to below the fault condition threshold.

Figure 6:
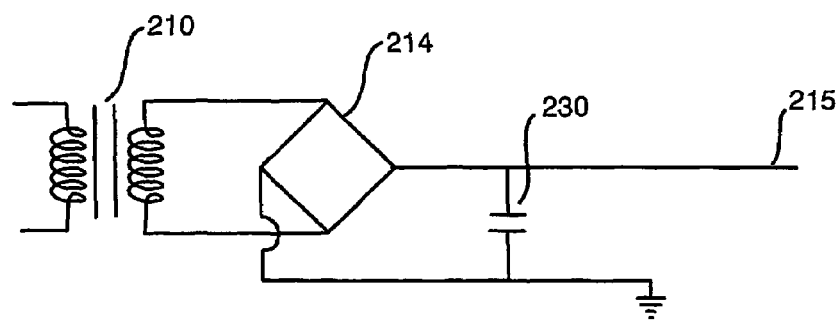
FIG. 6 shows an alternative circuit for the anode signal generator.
Figure 7A:
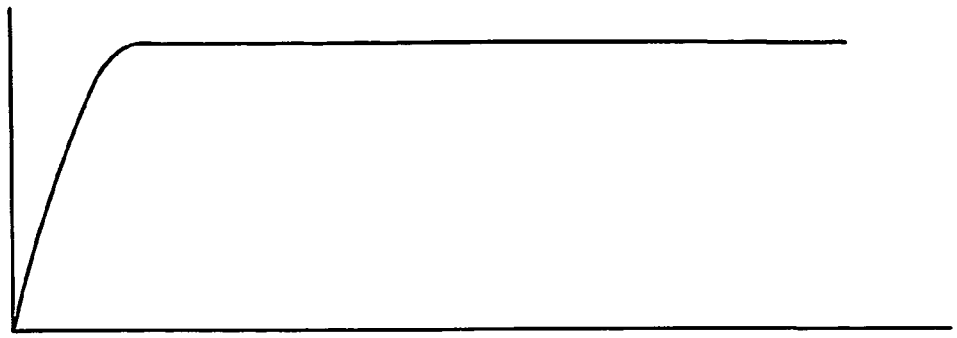
FIG. 7 shows the output of the circuit of FIG. 6.
Figure 7B:
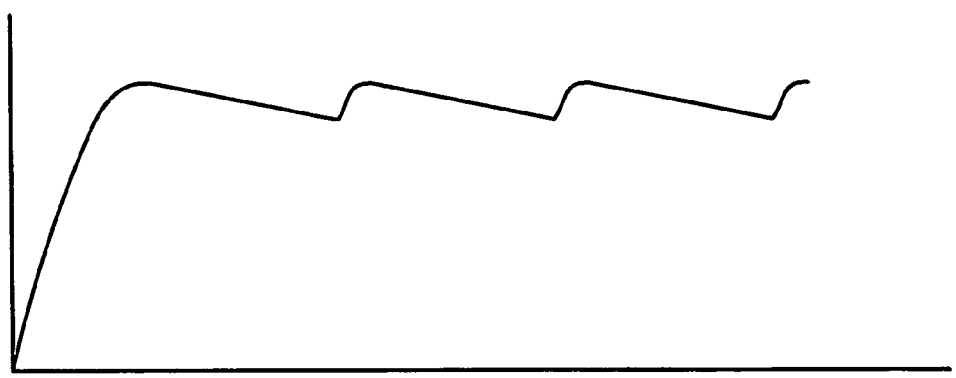
Figure 7C:
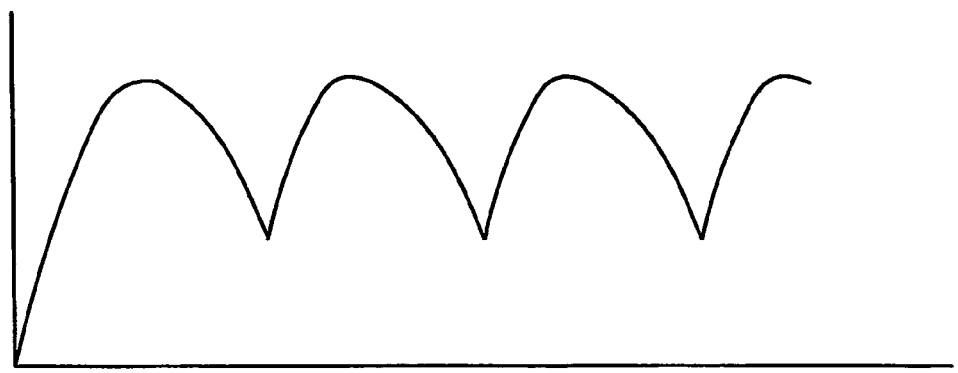

An alternative circuit for the anode voltage generator is shown in FIG. 6. In this circuit, a capacitor 230 is placed between the voltage and ground after the output of the diode bridge 214. The capacitor serves to flatten out the rectified mains voltage signal. Under no load, e.g. when there is no gas being provided to the ion source, the anode voltage will be substantially constant, as shown in FIG. 7A, because the capacitor will provide charge to the anode during the low portions of the mains voltage cycle. When the anode starts to draw current, i.e. when the ion current is produced, the capacitor will start to discharge during the low portions of the mains cycle (FIG. 7B). The amount that the capacitor discharges will depend on the size of the ion current and the capacitance. By matching the capacitance of the capacitor 230 to the typical operating conditions, the circuit can be made to remain above the ionization threshold so that the ion current is maintained for the full cycle. Alternatively, by providing a lower capacitance, the circuit can be made to extinguish the ion current, but for a briefer period than if no capacitor is provided. However, in each case, when an additional load is placed on the circuit, such as when a fault condition occurs, the additional load will draw extra current from the capacitor until the capacitor is discharged, and the voltage drops below the threshold required to maintain the fault condition and possibly also the ion current (FIG. 7C). That is, the anode voltage signal modulates above and below the fault condition threshold only during the presence of the fault condition.

As will be appreciated, the embodiments of the invention described herein demonstrate a simplified power supply. Large transients are prevented from occurring because the anode voltage is reduced below an ionization threshold, and to zero in preferred embodiments, at the end of every cycle.

Further protection is provided because the anode voltage is unregulated. That is, the maximum power that can be drawn from the anode circuit is limited by the voltage setting of the anode. When a fault condition occurs, the available voltage is shared between the ion current and the fault condition, and thus for the fault condition to grow, the ion current must shrink. If the anode voltage were to be regulated, then the anode voltage and ion current would be maintained even when the additional load of the fault condition was placed on the circuit. Thus regulating the anode voltage could potentially feed and maintain a fault condition, albeit only for the period of the voltage cycle.

While particular embodiments of this invention have been described, it will be evident to those skilled in the art that the present invention may be embodied in other specific forms without departing from the essential characteristics thereof. The present embodiments and examples are therefore to be considered in all respects as illustrative and not restrictive, and all changes which come within the meaning and range of equivalency are therefore intended to be embraced herein.

Throughout the specification, the word "comprising" and variations such as "comprise", "comprises" etc, are used inclusively, that is, the features specified may be combined with further features in various embodiments of the invention.

The invention claimed is:

1. A method of operating an ion source comprising providing a voltage signal to an anode at a first end of an ionization region of the ion source, providing a signal to a gas supply of the ion source to cause gas to be provided to the ionization region, providing a signal to a cathode at a second end of the ionization region opposite the first end to cause electrons to be emitted by the cathode such that electrons emitted by the cathode are accelerated through the ionization region toward the anode to cause ionization of the gas, thereby producing an ion current, wherein the anode voltage signal comprises a voltage that accelerates ions of the ion current out of the second end of the ionization region and that modulates between a first voltage above a threshold and a second voltage below the threshold.

2. A method according to claim 1 wherein the threshold is an ionization threshold.

3. A method according to claim 2 further comprising setting the threshold and the frequency and duty cycle of the modulation such that the ion current is extinguished during the period when the anode voltage signal is below the threshold.

4. A method according to claim 1 wherein the threshold is approximately 100 volts.

5. A method according to claim 1 wherein the threshold is approximately 60 volts.

6. A method according to claim 1 wherein the threshold is approximately 40 volts.

7. A method according to claim 1 wherein the second voltage is approximately zero.

8. A method according to claim 1 wherein the threshold is a fault condition threshold.

9. A method according to claim 8 further comprising setting the threshold and the frequency and duty cycle of the modulation such that a fault condition is alleviated during the period when the anode voltage signal is below the threshold.

10. A method according to claim 8 wherein the anode voltage signal modulates above and below a fault condition threshold only during the presence of the fault condition.

11. A method according to claim 1 wherein the frequency of the voltage cycle is greater than 1 Hz.

12. A method according to claim 11 wherein the frequency of the voltage cycle is greater than 10 Hz.

13. A method according to claim 1 wherein the frequency of the voltage cycle is greater than 90 Hz.

14. A method according to claim 1 wherein the anode voltage comprises a rectified mains signal.

15. A method according to claim 1 wherein the anode voltage signal is unregulated.

16. A method according to claim 1 further comprising providing a DC voltage to the anode.

17. A method according to claim 16 wherein the DC voltage is less than the threshold.

18. A control system for an ion source comprising an anode voltage generator, a gas supply signal generator and a cathode signal generator, wherein the anode voltage generator provides a voltage signal to an anode at a first end of an ionization region of the ion source, wherein the gas supply signal generator generates a signal to cause a gas to be provided to the ionization region of the ion source, wherein the cathode signal generator generates a signal to cause electrons to be emitted by a cathode at a second end of the ionization region opposite the first end such that electrons emitted by the cathode are accelerated through the ionization region toward the anode to cause ionization of the gas, and wherein the anode voltage generated comprises a voltage that accelerates ions out of the second end of the ionization region and that modulates between a first voltage above a threshold and a second voltage below the threshold.

19. A control system according to claim 18 wherein the anode voltage generator comprises a circuit generating a mains rectified voltage.

20. A control system according to claim 19 wherein the circuit generates a variable mains rectified voltage.

21. A control system according to claim 19 wherein the circuit comprises a bridge rectifier.

22. A control system according to claim 21 wherein the bridge rectifier comprises an anode voltage output and a ground, wherein the circuit further comprises a capacitor between the anode voltage output and ground.

23. A control system according to claim 19 wherein the circuit further generates a DC voltage to the anode.

24. A control system according to claim 23 wherein the DC voltage is less than the threshold.

25. A control system according to claim 18 wherein the second voltage is approximately zero.

26. A control system according to claim 18 wherein the threshold is less than 60 volts.

27. A control system according to claim 18 wherein the frequency of the voltage cycle is greater than 1 Hz.

28. A control system according to claim 18 wherein the frequency of the voltage cycle is greater than 10 Hz.

29. A control system according to claim 18 wherein the frequency of the voltage cycle is greater than 90 Hz.

30. An ion beam system comprising an ion source head and a control system, the ion source head comprising an anode, an electron emitting cathode, an ionization region disposed between said anode and said cathode, and a gas supply adapted to provide an ionizable gas to the ionization region, the control system comprising an anode voltage generator, a gas supply signal generator and a cathode signal generator, wherein the anode voltage generator provides a voltage signal to the anode, wherein the gas supply signal generator generates a signal to cause a gas to be provided to the ionization region, wherein the cathode signal generator generates a signal to cause electrons to be emitted by the cathode such that electrons emitted by the cathode are accelerated through the ionization region toward the anode to cause ionization of the gas, and wherein the anode voltage generated comprises a voltage that accelerates ions out of the second end of the ionization region and that modulates between a first voltage above a threshold and a second voltage below the threshold.

* * * * *